United States Patent [19]

Thomas, III et al.

[11] Patent Number: 5,273,610
[45] Date of Patent: Dec. 28, 1993

[54] APPARATUS AND METHOD FOR DETERMINING POWER IN PLASMA PROCESSING

[75] Inventors: John H. Thomas, III, Holland, Pa.; Bawa Singh, Voorhees, N.J.

[73] Assignee: Association Institutions for Material Sciences, Inc., Princeton, N.J.

[21] Appl. No.: 902,972

[22] Filed: Jun. 23, 1992

[51] Int. Cl.⁵ .................. H01L 21/00; C23C 16/50
[52] U.S. Cl. .................... 156/345; 156/626; 156/627; 118/723 E; 324/96
[58] Field of Search .............. 118/723; 156/345, 626, 156/627, 643; 324/96, 117

[56] References Cited

U.S. PATENT DOCUMENTS

| | | | |
|---|---|---|---|
| 4,609,426 | 9/1986 | Ogawa et al. | 156/627 X |
| 4,936,967 | 6/1990 | Ikuhara et al. | 156/626 X |
| 5,057,185 | 10/1991 | Thomas, III et al. | 156/643 |

FOREIGN PATENT DOCUMENTS

| | | |
|---|---|---|
| 0231264 | 12/1985 | Fed. Rep. of Germany . |
| 0087667 | 8/1978 | Japan . |
| 0008465 | 1/1979 | Japan . |
| 0062169 | 5/1980 | Japan . |
| 0062737 | 5/1980 | Japan . |
| 0171822 | 10/1983 | Japan . |
| 0023519 | 2/1984 | Japan . |
| 0244135 | 10/1987 | Japan . |
| 0280421 | 11/1988 | Japan . |
| 0035724 | 2/1990 | Japan . |
| 0754289 | 8/1980 | U.S.S.R. . |

OTHER PUBLICATIONS

Harshbarger et al., "Optical Detector to Monitor Plasma Etching", vol. 7, No. 3, Journal of Electronic Materials, 429–440 (1978).
Rummel, "Monitoring and Control of RF Electrical Parameters Near Plasma Loads", Industrial Heating, May 1991.

Primary Examiner—Brian E. Hearn
Assistant Examiner—Jonathan D. Baskin
Attorney, Agent, or Firm—Bell, Seltzer, Park & Gibson

[57] ABSTRACT

An apparatus and method including a current sensor having a radiation emitter, such as an electrical resistor, and a radiation detector, such as an infrared detector, for sensing current flowing to a plasma generating electrode from a radio frequency (RF) power source. The resistor may include a high emissivity infrared coating to enhance efficiency of the current sensor. The infrared detector provides a highly accurate indication of the average or root-mean-square current delivered to the plasma generating electrode without introducing parasitic capacitance into the measurement, or sensing, circuit. A voltage sensor and a second current sensor, such as a torroidal current sensor, provide the voltage and phase angle of the current delivered to the plasma generating electrode to thereby permit calculation of the power delivered to the plasma generating electrode. A processor controls the RF source responsive to the sensed average current, sensed voltage, and sensed phase angle of the current.

36 Claims, 4 Drawing Sheets

APPARATUS AND METHOD FOR DETERMINING POWER IN PLASMA PROCESSING

FIELD OF THE INVENTION

The present invention relates to the field of plasma processing and, more particularly, to an apparatus and method for determining the power delivered to a plasma generating electrode in radio frequency (RF) plasma processing.

BACKGROUND OF THE INVENTION

Plasma processing within an evacuable processing chamber is commonly used in semiconductor device fabrication, such as for etching or depositing materials on a semiconductor substrate. Radio frequency (RF) power is commonly used to generate the plasma within the processing chamber. It is important, therefore, to accurately control the RF power delivered to the plasma within the chamber. Accurate control of plasma processing conditions is essential to achieve the relatively small critical dimensions and precise tolerances required in fabricating modern integrated circuits. Accurate control of the power delivered to the plasma is also important, for example, to detect the end point of an etching operation.

Figure 1:
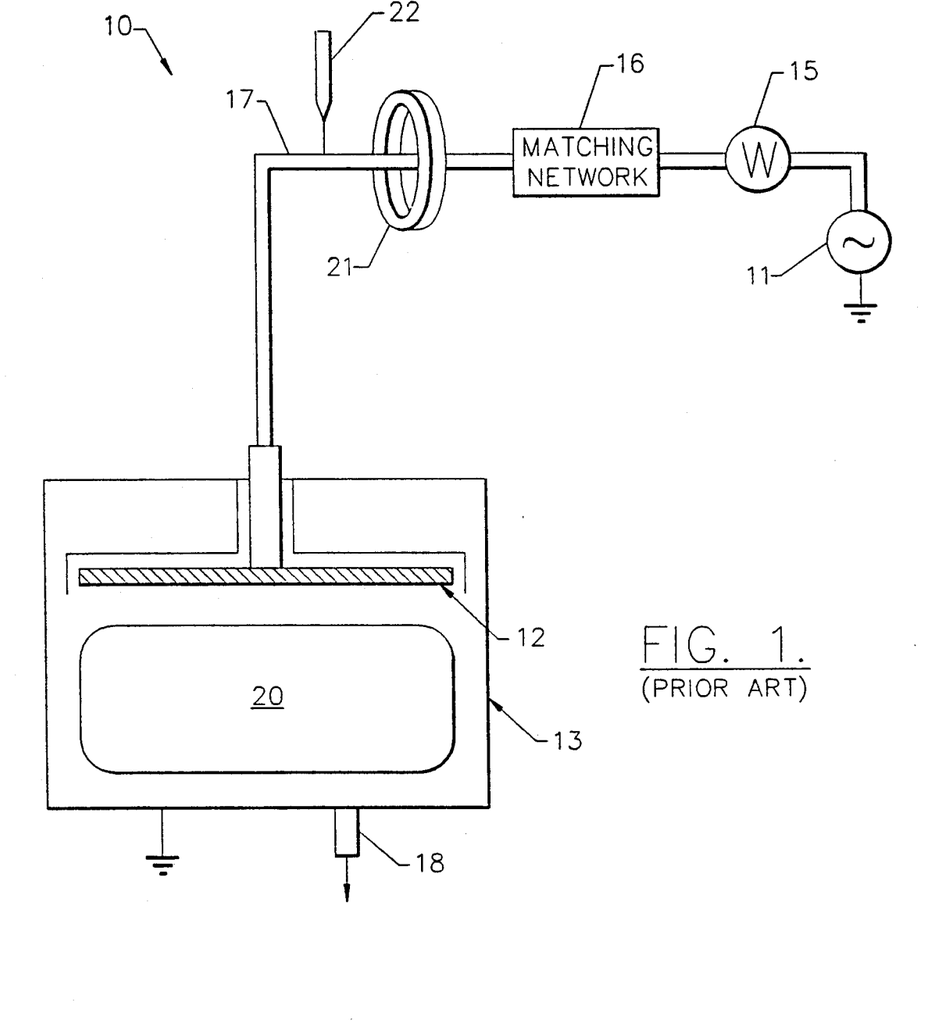
FIG. 1 is a schematic block diagram illustrating an RF plasma processing chamber and associated power monitoring circuit of the prior art.

In a typical RF plasma processing apparatus 10 of the prior art as shown schematically in FIG. 1, an RF generator 11 is coupled to a shielded plasma generating electrode 12 positioned within an evacuable processing chamber 13. The connection to the electrode 12 made via an insulated feedthrough 14 extending through a wall of the processing chamber 13. The RF source 11 is coupled to the plasma generating electrode 12 through a conventional power meter 15, matching network 16, and RF connection 17. The processing chamber 13 may be evacuated using an exhaust port 18. The RF power delivered by the electrode 12 interacts with a process gas introduced into the chamber 13 through an inlet, not shown, to thereby produce the plasma 20 for semiconductor processing.

Accurate control of the power delivered to the plasma requires that the power delivered to the plasma be first readily and accurately determined or measured. As complete layers of a material are etched away by the plasma, for example, it is important to sense the resultant change in the impedance of the plasma and alter the processing conditions responsive to the sensing of these end point conditions. Unfortunately, conventional devices and techniques for determining the power delivered to the plasma generating electrode are not sufficiently accurate for many such applications.

As shown in FIG. 1, in a typical conventional RF plasma processing application, a torroidal current sensor 21 and high voltage sensor 22 have been used to determine the power delivered to the plasma generating electrode 12, and hence the power delivered to the plasma 20, from the RF generator 11. The torroidal current sensor 21 is coupled to the RF connection 17 from the RF generator 11. The outputs from the voltage sensor 22 and the torroidal current sensor 21 may be displayed on an oscilloscope or used by a microprocessor-based controller, not shown, to regulate the power delivered to the plasma 20 by the RF generator 11. A conventional RF plasma processing monitoring and control system of this type is commercially available from Comdel, Inc. of Beverly, Mass., under the model designation RPM-1.

Unfortunately, this type of indirect measurement of current using only a torroidal current sensor is susceptible to parasitic capacitance induced errors. More particularly, the errors result, in part, due to the placement of shielding relative to the current carrying inner conductor and the position of the shield relative to ground in the matching network where the torroidal sensor is typically installed.

Attempts have been made to determine the power delivered to the plasma in plasma processing apparatus using other approaches. For example, Japanese Patent No. 58-171822 to Ogawa entitled *Dry Etching*, discloses a probe inserted directly into plasma. The current flowing into the probe is measured by an ammeter through a high frequency filter. Another plasma-intrusive type of measuring device is disclosed in Japanese Patent No. 2-35724 to Fujita entitled *Plasma Etching Monitoring Method*. The Fujita patent discloses a Rogowski coil arranged between an upper electrode and a lower electrode and monitored by an integrator and oscilloscope to thereby determine the stability of etching and the end point of a particular etch. Similarly, Japanese Patent No. 63-280421 to Miyahara entitled *Method and Apparatus for Controlling Working Depth of Dry Etching* discloses a circuit for measuring the ion current flow using a probe in the ion current stream within the processing chamber.

SUMMARY OF THE INVENTION

In view of the foregoing background, it is therefore an object of the present invention to provide an apparatus and a method for accurately determining the power delivered to a plasma generating electrode in an RF plasma processing apparatus.

It is another object of the present invention to provide an apparatus and method for controlling an RF power source in a plasma processing apparatus responsive to an accurate determination of the current delivered to the plasma generating electrode.

These and other objects according to the invention are provided by an electrical current sensor including radiation emitter means electrically connected between the RF source and the plasma generating electrode, and radiation detector means spaced apart from the radiation emitter means for sensing the radiation emitted by the radiation emitter means. The current sensor thus produces a signal relating to the electrical current delivered to the plasma generating electrode from the RF source.

The radiation emitter means is preferably an electrical resistor that emits radiation, such as infrared radiation, responsive to the current flowing through the resistor. The radiation detector means is thus preferably an infrared detector to thereby generate a signal relating to the current flowing in the radiation emitter means indicative of the current delivered to the plasma generating electrode.

The electrical resistor is connected in series between the RF source and the plasma generating electrode. The infrared detector is positioned in an optical path to the electrical resistor. The electrical resistor preferably includes a high emissivity infrared coating to enhance radiation emission in the infrared region of the electromagnetic spectrum. The electrical resistor also preferably has a relatively low electrical resistance, such as less than about 0.5 ohms, compared to the electrical resistance of a plasma generated by the electrode. The electrical resistor also preferably has a generally strip-like shape and a relatively short length so as to reduce its electrical inductance.

In a first embodiment of the invention, the electrical resistor is positioned in a portion of the processing chamber adjacent the plasma generating electrode. This location adjacent the electrode provides a highly accurate indication of the current delivered to the plasma generating electrode. The processing chamber also includes a radiation (infrared) transmissive viewing port so that the infrared detector may be positioned outside of the processing chamber.

In a second embodiment of the invention, the electrical resistor is enclosed within an evacuated housing for enhancing thermal insulation and is also adapted for an in-line connection to a coaxial transmission line connected between the RF source and the plasma generating electrode. In this embodiment, the housing for the electrical resistor preferably carries a pair of conventional coaxial connectors electrically connected to respective opposite ends of the electrical resistor.

To determine the power delivered to the electrode, the voltage of the plasma generating electrode must also be sensed. Therefore, a conventional voltage sensor is preferably operatively connected to the plasma generating electrode as would be readily understood by those skilled in the art. An additional current sensor is required to sense the phase angle of the current relative to the voltage, since the current sensor according to the invention may only provide the average or root-mean-square (RMS) value of the current. Thus, a conventional torroidal current sensor may be coupled to the RF connection to the plasma generating electrode for sensing the phase angle of the current being delivered to the electrode.

A processor, such as a microprocessor or other signal processing means, is preferably operatively connected to the infrared detector, the voltage sensor, and the torroidal current sensor for determining the power delivered to the plasma generating electrode. The torroidal current sensor is used to obtain the relative phase angle between the current and the voltage, while the highly accurate current sensed by the electrical resistor and infrared detector is used in place of the current from the torroidal sensor to thereby determine the power delivered to the plasma generating electrode. The processor also preferably controls the RF source to maintain the power delivered to the electrode within a predetermined range or at a predetermined setpoint.

A second electrical current sensor including the electrical resistor and infrared detector may also preferably be provided between the RF generator and the matching network. The second electrical current sensor senses electrical current independent of the voltage standing wave ratio (VSWR), since the VSWR is typically 1:1 at the point between the RF generator and the matching network. The output of the second electrical current sensor may be used to facilitate obtaining repeatable etching or deposition processing conditions.

The method according to the present invention includes the steps of connecting the electrical resistor of the current sensor in series with the plasma generating electrode and the RF source, and sensing the emitted radiation from the electrical resistor to thereby produce a signal related to the current delivered to the plasma generating electrode. The electrical resistor is preferably physically positioned closely adjacent to the electrode to thereby obtain a relatively accurate current sensing of the power delivered to the electrode.

As noted above with respect to the apparatus according to the invention, the method for determining the power delivered to a plasma preferably includes sensing the voltage of the plasma generating electrode, sensing an average current flow from the RF source to the electrode using the electrical resistor and infrared detector, sensing the phase angle of the current flow to the electrode, and determining the power from the voltage, average current flow, and phase angle between the current and the voltage. The power output of the RF source may then be controlled within a predetermined range or to a predetermined setpoint responsive to the thus determined power.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, the Applicants provide these embodiments so that this disclosure will be thorough and complete, and will fully convey the scope of the invention to those skilled in the art. Prime notation is used to indicate similar elements in alternate embodiments of the invention.

Figure 2:
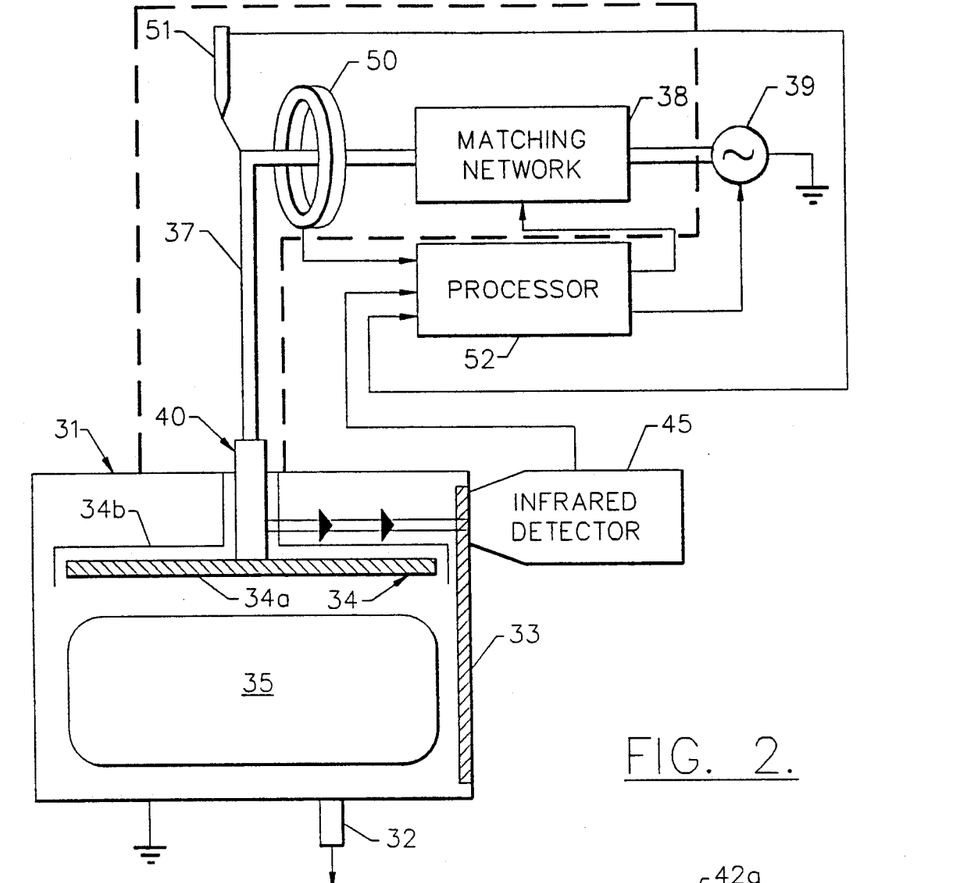
FIG. 2 is a schematic block diagram, partially in section, of an RF plasma processing apparatus according to the present invention.

Referring to FIG. 2, there is shown an embodiment of a plasma processing apparatus 30 according to the invention. The plasma processing apparatus 30 includes an evacuable plasma processing chamber 31 having a gas exhaust port 32, a viewing port 33, and a plasma generating electrode 34 contained therein. RF power is delivered to the plasma generating electrode 34 to generate a plasma 35 within the chamber 31, such as for semiconductor etching or deposition. The plasma generating electrode 34 is of a conventional type and preferably includes a grounded shield portion 34b surrounding an electrode portion 34a.

The plasma processing apparatus 30 further includes a matching network 38 and an RF generator 39 coupled to the plasma generating electrode 34 via an RF connection 37. As used herein, the term RF source is alternately used to describe the combination of the matching network 38 and the RF generator 39. As schematically illustrated in FIG. 2, the circuitry of the matching network 38 is typically contained within a housing, represented by the dashed line, mounted on top of the plasma processing chamber 31.

Figure 3:
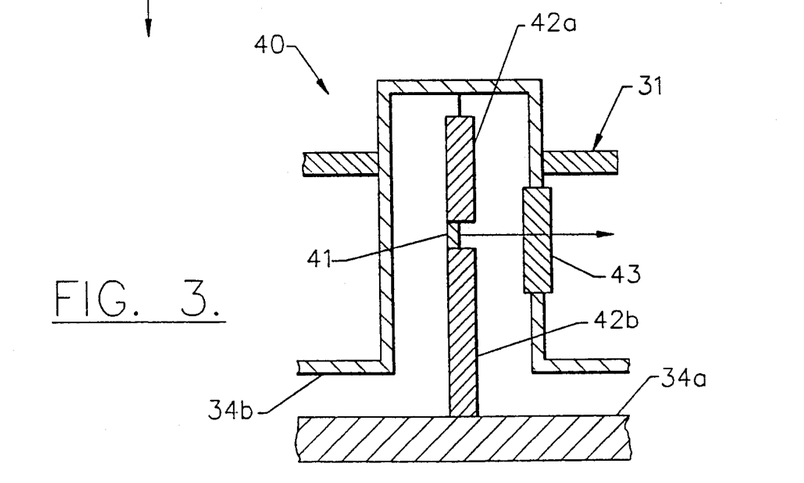
FIG. 3 is a greatly enlarged schematic view of a portion of the RF plasma processing apparatus shown in FIG. 2 illustrating the electrical resistor of the current sensor according to the present invention.

As illustrated in FIG. 2 and the greatly enlarged view of FIG. 3, a current sensor 40 for the average current, or root-mean-square (RMS) current, delivered to the plasma generating electrode 34 is provided by radiation emitter means, such as an electrical resistor, connected in series between the RF connection 37 and the electrode. The current sensor 40 includes an emissive resistor strip 41, preferably of copper and having a high emissivity infrared coating thereon, held in position between two spaced apart mounting supports 42a, 42b. As would readily be understood by those skilled in the art, heat will flow into the rather large masses of the mounting supports 421, 42b producing an exponentially increasing background termperature that will reach a steady state after a relatively long time. Therefore, the temperature of the emissive resistor strip 41 may be readily measured in a differential fashion from the background temperature.

The high emissivity coating may preferably be a black paint or other coating as would be readily understood by one skilled in the art. An infrared transmissive window 43 is also provided adjacent to the emissive resistor strip 41. The transmission characteristics of the window 43 are preferably matched to the spectral characteristics of a radiation detector, such as the infrared detector 45 shown schematically in FIG. 2.

The infrared detector 45 is preferably positioned adjacent the processing chamber viewing port 34 in the optical path of the current sensor 40. As would be readily understood by those skilled in the art, the current passing through the current sensor 40 will cause a temperature rise in the emissive resistor strip 41 which can be sensed by the infrared detector 45 to produce a signal relating to electrical current flowing through the current sensor 40 and, thus, being delivered to the plasma-generating electrode 34. The high emissivity infrared coating enhances the efficiency of the current sensor. In addition, since the current is sensed without inducing additional parasitic capacitance to the overall power delivery circuit, an accurate determination of the average or RMS value of the electrical current may be obtained according to the invention.

Since only the average or RMS value of the current may be obtained by the current sensor 40, a conventional torroidal current sensor 50 and a voltage sensor 51 may also be used to provide the current phase angle signal and voltage signal, respectively, to thereby permit calculation of the power delivered to the plasma generating electrode 34. A processor 52, such as a microprocessor operating under stored program control or other equivalent circuit, is operatively connected to the infrared detector 45, the torroidal current sensor 50, and the voltage sensor 51.

The processor 52 first calculates the average or RMS current signal based upon the signal from the infrared detector 45. More particularly, the average current from the current sensor 40 according to the invention is substituted for the current measured by a conventional torroidal sensor 50. The output signal from the voltage sensor 51 and the output signal from the torroidal current sensor 50 are used to calculate a phase angle difference ($\Theta$) between the current (I) and voltage (V) by detecting either the cross over angular difference in the respective current and voltage sinusoidal signals or the peak angular difference between these two signals. Thus, the power (P) delivered to the plasma generating electrode 34 is given by:

$$P = IV\cos\Theta$$

where I is the current sensed by the current sensor 40 according to the invention. The processor then adjusts the matching network 38 and RF generator 39 to maintain the power delivered to the plasma generating electrode 34 within a predetermined range or at a predetermined setpoint.

Figure 4:
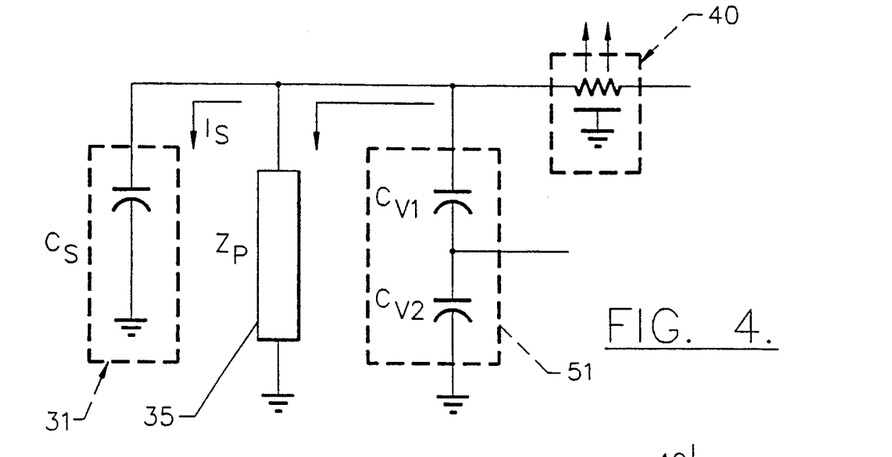
FIG. 4 is a schematic equivalent circuit diagram of a portion of the circuit shown in FIG. 4.

The current sensor 40 according to the present invention provides a highly accurate determination of the power delivered to the plasma generating electrode 34. In the prior art, only a single torroidal current sensor 21 (FIG. 1) was provided. The torroidal sensor introduced parasitic capacitance into the measurement circuit and thus decreased the accuracy of the current determination. However, as shown in the schematic equivalent circuit diagram of FIG. 4, only the parasitic capacitance $C_S$ of the chamber walls and shielded electrode portion of the electrode may affect the accuracy of the current sensor 40 of the present invention. As shown in the equivalent circuit, the voltage sensor 51 is typically coupled to the overall power delivery circuit by a voltage divider formed by a pair of capacitors $C_{V1}$, $C_{V2}$, the value of each being known during sensing of the current. $Z_P$ is the complex impedance of the plasma 35. Accordingly, the distributed capacitance of the electrical resistor 40 to ground, represented by $C_R$, is advantageously made Very small so that only $C_S$ affects an accurate measurement of the current $I_P$ delivered to the plasma generating electrode 34 and, hence, to the plasma 35.

Figures 5, 6:
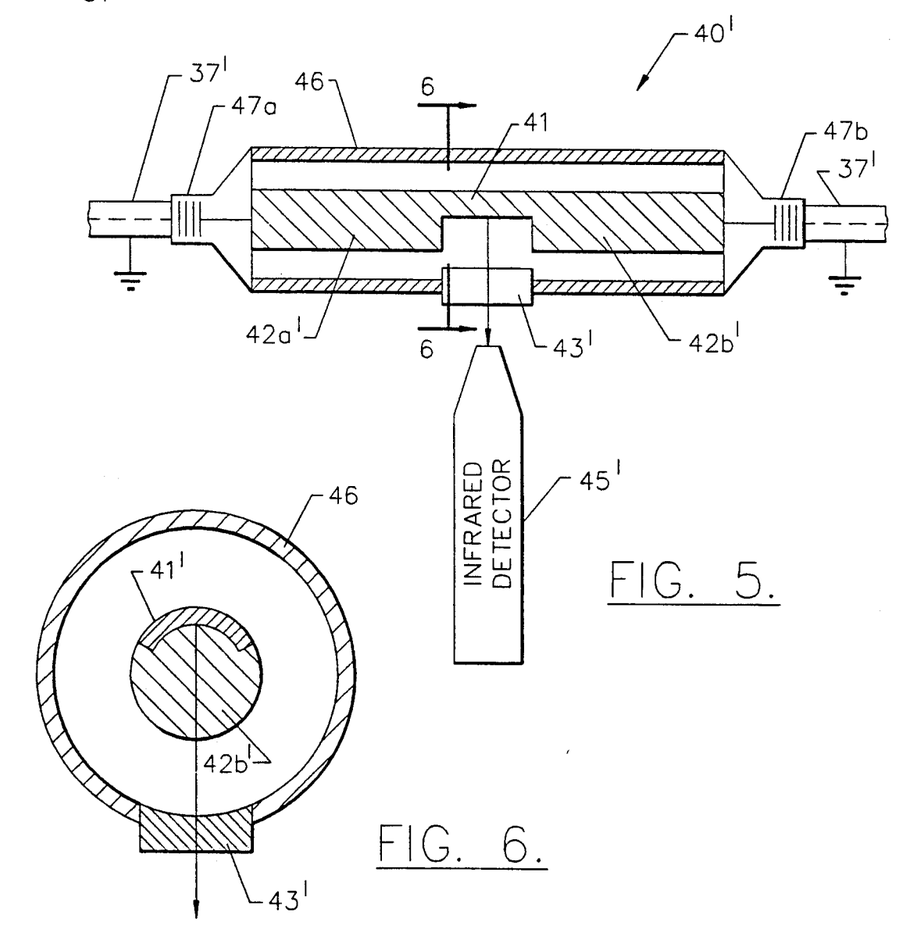
FIG. 5 is a schematic diagram, partially in section, of another embodiment of the current sensor according to the invention.
FIG. 6 is an enlarged cross-sectional view taken along lines 6—6 of FIG. 5.

Referring now to FIGS. 5 and 6, an alternate embodiment of the current sensor 40' including an emissive resistor strip 41' and an infrared detector 45' according to the invention is shown. This embodiment is adapted for in-line connection to a coaxial type transmission line 37', such as a 50 ohm coaxial cable, for the RF connection delivering power to the plasma generating electrode 34 (FIG. 3). In this embodiment, an evacuated housing 46 surrounds the emissive resistor strip 41' and associated mounting supports 42a', 42b' therefor. In addition, a pair of coaxial connectors 47a, 47b are carried by respective opposing ends of the housing 46 and these connectors are electrically connected to respective mounting supports 42a', 42b'. The housing 46 is also desirably electrically conductive to provide the shield connection for the transmission line 37'. The spacing between the inner surface of the housing 46' and the outer surface of the mounting supports 42a', 42b', as well as the spacing between the inner surface of the housing 46' and the outer surface of the emissive resistor strip 41', are both preferably sized to match the current sensor 40' to the impedance of the coaxial transmission line 37'.

The housing 46' also includes an infrared transmissive window portion 43' therein to permit the infrared detector 45' to be positioned in the optical path to the emissive resistor strip 41'. The emissive strip preferably has a resistance of not greater than about 0.5 ohms so as to produce a relatively insubstantial power drop in the power delivered to the plasma generating electrode. The emissive resistor strip 41' preferably has an arcuate cross-sectional shape, as illustrated, and may be readily formed by removing a portion of a conductive cylindrical rod to thereby integrally form the supports 42a', 42b and the emissive strip. The reduced cross-sectional area of the emissive strip may be selected to provide a predetermined resistance. The arcuate shape of the emissive resistor strip 41' serves as a further aid in matching the current sensor 40' to the impedance of the coaxial transmission line 37'. The emissive resistor strip 41' also preferably has a relatively short length of less than about 5 mm to reduce the electrical inductance thereof.

The infrared detector 45' is preferably responsive to the long infrared wavelengths between 8–10 μm. A suitable detector is available from Omega Engineering of Stamford, Conn. under the model designation Omega OS500. Accordingly, the transmissive window portion 43' of the housing is also preferably transmissive to the infrared wavelengths in the 8–10 μm range.

A typical plasma processing apparatus delivers about 400–1000 watts to the plasma generating electrode with a peak-to-peak voltage of about 1 KV. Thus, a corresponding electrical current to the plasma would result in an estimated temperature rise of not more than about 50° C. for the emissive resistor strip 41' as described herein.

Figure 7:
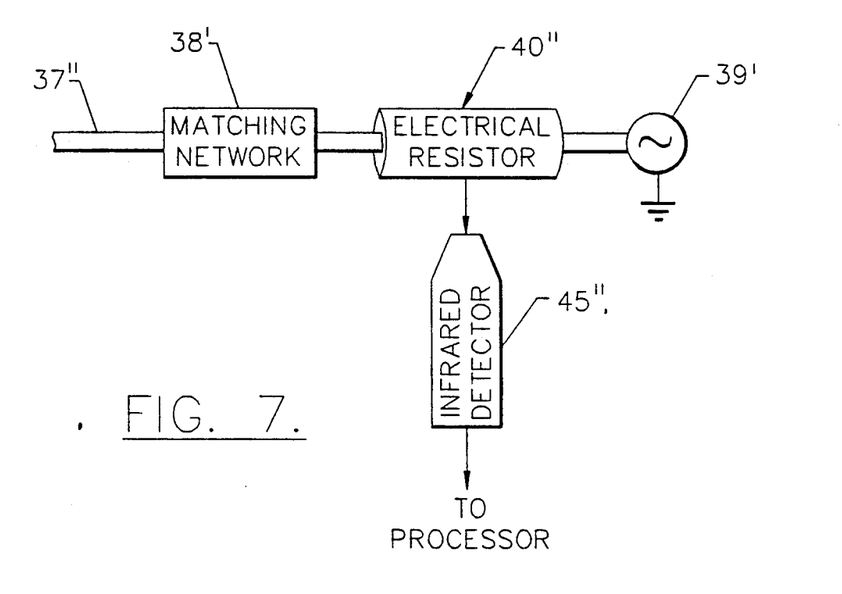
FIG. 7 is a schematic block diagram of an alternate embodiment of a portion of the circuit shown in FIG. 2.

Referring now to FIG. 7, another important aspect of the present invention is shown. A second current sensor 40'', of the type illustrated in FIGS. 5 and 6, is connected in series with an RF generator 39' and its associated matching network 38'. At this point in the circuit, the voltage standing wave ratio (VSWR) is 1:1, that is, the RF generator 39' is matched to the matching network 38'. Accordingly, the current sensor 40'' measures the absolute power ($I^2R$) delivered to the matching network 38'. This arrangement has an advantage over conventional power meters in that the power measured is not a function of the VSWR. Using the second current sensor 40'' in combination with the first current sensor 40', measurements can be made of both the power supplied to the matching network 39' and the power supplied to the plasma generating electrode 34'. Combining these measurements with a measurement of VSWR by a conventional power meter, not shown, permits accurate control and resetting of the plasma processing apparatus to the same processing conditions for repeatable operations. Thus, overall process control and repeatability are greatly enhanced.

The method according to the present invention includes the steps of connecting the electrical resistor in series with the plasma generating electrode and the RF source and sensing the emitted radiation from the electrical resistor to thereby produce a signal related to the current delivered to the plasma generating electrode. To control the power delivered to the plasma, the voltage of the plasma generating electrode, as well as the phase angle of the current delivered thereto are also preferably sensed.

The average current sensed by the electrical resistor can be used in place of the current sensed by a conventional torroidal current sensor. The thus determined power may then be used to control the RF source to a predetermined operating range or to a predetermined setpoint. An additional current sensor employing the emissive resistor strip may also advantageously be connected between the RF generator and the matching network to facilitate obtaining repeatable processing conditions for the plasma processing apparatus.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A radio frequency (RF) plasma processing apparatus comprising:
   a processing chamber;
   a plasma generating electrode positioned in said processing chamber;
   a radio frequency (RF) source connected to said plasma generating electrode; and
   an electrical current sensor comprising radiation emitter means operatively connected to said plasma generating electrode for emitting radiation responsive to electrical current delivered to said plasma generating electrode, and radiation detector means spaced apart from said radiation emitter means for detecting radiation emitted therefrom to produce a signal relating to electrical current delivered to said plasma generating electrode.

2. An apparatus according to claim 1 wherein said radiation emitter means comprises an electrical resistor electrically connected in series between said RF source and said plasma generating electrode.

3. An apparatus according to claim 2 wherein said electrical resistor has a relatively low resistance compared to the resistance of plasma generated in said processing chamber so that only a relatively insubstantial portion of power from said RF source is dissipated by said electrical resistor.

4. An apparatus according to claim 3 wherein said electrical resistor has a resistance of less than about 0.5 ohms.

5. An apparatus according to claim 2 wherein said electrical resistor has a strip-like shape and a relatively short length so as to reduce the electrical inductance thereof.

6. An apparatus according to claim 2 further comprising a high emissivity infrared coating on said electrical resistor; and wherein said radiation detector means comprises an infrared detector.

7. An apparatus according to claim 2 wherein said electrical current sensor further comprises an evacuated housing surrounding said electrical resistor for thermally insulating same; and wherein said evacuated housing includes a radiation transmissive window portion therein.

8. An apparatus according to claim 7 further comprising a coaxial transmission line connecting said RF source to said plasma generating electrode; and wherein said current sensor further comprises a pair of coaxial connectors carried by said housing and electrically connected to respective opposite ends of said electrical resistor.

9. An apparatus according to claim 1 wherein said radiation emitter means is positioned in said processing chamber adjacent said plasma generating electrode; wherein said processing chamber includes a radiation transmissive window portion therein; and wherein said radiation detector means is positioned outside of said processing chamber.

10. A radio frequency (RF) plasma processing apparatus comprising:
    a processing chamber;

a plasma generating electrode positioned in said processing chamber;

an radio frequency (RF) source connected to said plasma generating electrode;

a first electrical current sensor comprising radiation emitter means operatively connected to said plasma generating electrode for emitting radiation responsive to electrical current delivered to said plasma generating electrode, and radiation detector means spaced apart from said radiation emitter means for detecting radiation emitted therefrom to produce a signal relating to electrical current delivered to said plasma generating electrode;

a voltage sensor operatively connected to said plasma generating electrode;

a second electrical current sensor operatively connected to said plasma generating electrode for sensing the phase angle of electrical current delivered thereto; and processor means operatively connected to said voltage sensor, said radiation detector means of said first electrical current sensor, and said second electrical current sensor for determining power delivered to said plasma generating electrode.

11. An apparatus according to claim 10 wherein said radiation emitter means comprises an electrical resistor electrically connected in series between said RF source and said plasma generating electrode.

12. An apparatus according to claim 11 wherein s electrical resistor has a relatively low resistance compared to the resistance of plasma generated in said processing chamber so that only a relatively insubstantial portion of power from said RF source is dissipated by said electrical resistor.

13. An apparatus according to claim 12 wherein said electrical resistor has a resistance of less than about 0.5 ohms.

14. An apparatus according to claim 11 wherein said electrical resistor has a strip-like shape and a relatively short length so as to reduce the electrical inductance thereof.

15. An apparatus according to claim 11 further comprising a high emissivity infrared coating on said electrical resistor; and wherein said radiation detector means comprises an infrared detector.

16. An apparatus according to claim 11 wherein said first electrical current sensor further comprises an evacuated housing surrounding said electrical resistor for thermally insulating same; and wherein said evacuated housing includes a radiation transmissive window portion therein.

17. An apparatus according to claim 16 further comprising a coaxial transmission line connected between said RF source and said plasma generating electrode; and wherein said first electrical current sensor further comprises a pair of coaxial connectors carried by said housing and electrically connected to respective opposite ends of said electrical resistor.

18. An apparatus according to claim 10 wherein said second electrical current sensor comprises a torroidal current sensor.

19. An apparatus according to claim 10 wherein said processor means includes means for controlling said RF source within a predetermined range responsive to power delivered to said plasma generating electrode.

20. An apparatus according to claim 10 wherein said radiation emitter means is positioned in said processing chamber adjacent said plasma generating electrode; wherein said processing chamber includes a radiation transmissive window portion therein; and wherein said radiation detector means is positioned outside of said processing chamber.

21. An electrical current sensor adapted for use with a radio frequency (RF) plasma processing apparatus including an RF generator connected to a plasma generating electrode through a matching network, the plasma generating electrode being positioned within a processing chamber, said electrical current sensor comprising:

an electrical resistor adapted to be electrically connected in series between the RF generator and the plasma generating electrode for emitting radiation responsive to electrical current flowing through said electrical resistor; and a radiation detector positioned in spaced apart relation from said electrical resistor for sensing radiation emitted therefrom to produce a signal relating to electrical current flowing therethrough.

22. An apparatus according to claim 21 wherein said electrical resistor has a relatively low resistance compared to the resistance of plasma generated in said processing chamber so that only a relatively insubstantial portion of power from said RF source is dissipated by said electrical resistor.

23. An electrical current sensor according to claim 22 wherein said electrical resistor has a resistance of not greater than about 0.5 ohms.

24. An electrical current sensor according to claim 21 wherein said electrical resistor has a strip-like shape and a relatively short length so as to reduce the electrical inductance thereof.

25. An electrical current sensor according to claim 21 further comprising a high infrared emissivity coating on said electrical resistor; and wherein said radiation detector comprises an infrared detector.

26. An electrical current sensor according to claim 21 further comprising a housing surrounding said electrical resistor, said housing including a radiation transmissive window portion therein.

27. An electrical current sensor according to claim 26 wherein said housing is an evacuated housing for thermally insulating said electrical resistor.

28. An electrical current sensor according to claim 26 further comprising a pair of coaxial connectors carried by said housing and electrically connected to respective opposite ends of said electrical resistor.

29. An electrical current sensor according to claim 26 further comprising a pair of electrically conductive mounting supports positioned within said housing and mounting said electrical resistor therebetween so that said electrical resistor and said mounting supports are positioned in spaced relation from said housing.

30. An electrical current sensor according to claim 29 wherein said housing is electrically conductive; and wherein the spacing between said housing and said electrical resistor and the spacing between said housing and said pair of mounting supports are each selected to provide a predetermined impedance.

31. A method for determining the current delivered to a plasma generating electrode from a radio frequency (RF) source, said method comprising the steps of:

connecting an electrical resistor in series between the plasma generating electrode and the RF source, the electrical resistor emitting radiation responsive to electrical current flowing therethrough; and sensing the emitted radiation from the electrical resistor to thereby produce a signal related to electrical current delivered to the plasma generating electrode.

32. A method according to claim 31 further comprising the steps of:
sensing the voltage of the plasma generating electrode;
sensing the phase angle of the current to the plasma generating electrode; and
determining the power delivered to the plasma generating electrode based upon the voltage, the current, and the phase angle of the current relative to the voltage.

33. A method according to claim 32 further comprising the step of controlling the RF source within a predetermined output range responsive to the thus determined power delivered to the plasma generating electrode.

34. A method according to claim 31 wherein the step of sensing the emitted radiation from the electrical resistor comprises sensing the infrared radiation emitted therefrom.

35. A method according to claim 31 wherein the step of connecting the electrical resistor in series with the RF source and the plasma generating electrode comprises the step of positioning the electrical resistor closely adjacent the plasma generating electrode to thereby obtain a relatively accurate sensing of current delivered to the plasma generating electrode.

36. A method according to claim 31 wherein the RF source comprises an RF generator and a matching network connected thereto; and further comprising the steps of connecting a second electrical resistor in series between the RF generator and the matching network, the electrical resistor emitting radiation responsive to a current flowing therethrough, and sensing the emitted radiation from the second electrical resistor to thereby produce a signal related to the current delivered to the matching network from the RF generator.

* * * * *